US012040392B2

(12) United States Patent
Su et al.

(10) Patent No.: US 12,040,392 B2
(45) Date of Patent: Jul. 16, 2024

(54) HIGH ELECTRON MOBILITY TRANSISTOR AND METHOD FOR FABRICATING THE SAME

(71) Applicant: UNITED MICROELECTRONICS CORP., Hsin-Chu (TW)

(72) Inventors: Po-Wen Su, Kaohsiung (TW);
Ming-Hua Chang, Tainan (TW);
Shui-Yen Lu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 71 days.

(21) Appl. No.: 18/075,427

(22) Filed: Dec. 6, 2022

(65) Prior Publication Data

US 2023/0102890 A1    Mar. 30, 2023

Related U.S. Application Data

(62) Division of application No. 16/809,524, filed on Mar. 4, 2020, now Pat. No. 11,552,187.

(30) Foreign Application Priority Data

Feb. 6, 2020    (CN) .................. 202010081655.1

(51) Int. Cl.
*H01L 29/66* (2006.01)
*H01L 29/06* (2006.01)
*H01L 29/20* (2006.01)
*H01L 29/205* (2006.01)
*H01L 29/778* (2006.01)

(52) U.S. Cl.
CPC ...... *H01L 29/7786* (2013.01); *H01L 29/0657* (2013.01); *H01L 29/2003* (2013.01); *H01L 29/205* (2013.01); *H01L 29/66462* (2013.01); *H01L 29/7787* (2013.01)

(58) Field of Classification Search
CPC .................................. H01L 29/66462
See application file for complete search history.

(56) References Cited

U.S. PATENT DOCUMENTS 9,048,303 B1   6/2015  Ostermaier
10,283,614 B1  5/2019  Lu
(Continued)

FOREIGN PATENT DOCUMENTS

CN    105322016 A    2/2016
JP    2011-155221 A  8/2011

OTHER PUBLICATIONS

Okita , Title: Through Recessed and Regrowth Gate Technology for Realizing Process Stability of GaN—GITs; Proceedings of the 2016 28th International Symposium on Power Semiconductor Devices and ICs (ISPSD) ,Jun. 12, 2016.
(Continued)

*Primary Examiner* — Grant S Withers
(74) *Attorney, Agent, or Firm* — Winston Hsu

(57) ABSTRACT

A method for fabricating high electron mobility transistor (HEMT) includes the steps of: forming a buffer layer on a substrate; forming a patterned mask on the buffer layer; using the patterned mask to remove the buffer layer for forming ridges and a damaged layer on the ridges; removing the damaged layer; forming a barrier layer on the ridges; and forming a p-type semiconductor layer on the barrier layer.

12 Claims, 8 Drawing Sheets

(56) References Cited

U.S. PATENT DOCUMENTS

| | | | |
|---|---|---|---|
| 2014/0097468 A1* | 4/2014 | Okita | H01L 29/42316 |
| | | | 257/192 |
| 2016/0043187 A1 | 2/2016 | Saito | |
| 2017/0345921 A1 | 11/2017 | Feng | |
| 2018/0197999 A1 | 7/2018 | Palacios | |
| 2018/0269282 A1 | 9/2018 | Yang | |
| 2019/0088773 A1 | 3/2019 | Armstrong | |
| 2020/0373383 A1 | 11/2020 | Zhang | |

OTHER PUBLICATIONS

Borga et al., "Impact of the substrate and buffer design on the performance of GaN on Si power HEMTs", Microelectronics Reliability, Sep. 30, 2018, pp. 584-588, vol. 88-90.

* cited by examiner

K ←——————————→ K'

L ←——————————→ L'

HIGH ELECTRON MOBILITY TRANSISTOR AND METHOD FOR FABRICATING THE SAME

CROSS REFERENCE TO RELATED APPLICATIONS

This application is a division of U.S. application Ser. No. 16/809,524, filed on Mar. 4, 2020. The content of the application is incorporated herein by reference.

BACKGROUND OF THE INVENTION

1. Field of the Invention

The invention relates to a high electron mobility transistor (HEMT) and method for fabricating the same.

2. Description of the Prior Art

High electron mobility transistor (HEMT) fabricated from GaN-based materials have various advantages in electrical, mechanical, and chemical aspects of the field. For instance, advantages including wide band gap, high break down voltage, high electron mobility, high elastic modulus, high piezoelectric and piezoresistive coefficients, and chemical inertness. All of these advantages allow GaN-based materials to be used in numerous applications including high intensity light emitting diodes (LEDs), power switching devices, regulators, battery protectors, display panel drivers, and communication devices.

SUMMARY OF THE INVENTION

According to an embodiment of the present invention, a method for fabricating high electron mobility transistor (HEMT) includes the steps of: forming a buffer layer on a substrate; forming a patterned mask on the buffer layer; using the patterned mask to remove the buffer layer for forming ridges and a damaged layer on the ridges; removing the damaged layer; forming a barrier layer on the ridges; and forming a p-type semiconductor layer on the barrier layer.

According to another aspect of the present invention, a high electron mobility transistor (HEMT) includes: a buffer layer on a substrate; ridges extending along a first direction on the buffer layer; a p-type semiconductor layer extending along a second direction on the substrate; a barrier layer between the buffer layer and the p-type semiconductor layer; and a source electrode and a drain electrode adjacent to two sides of the p-type semiconductor layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
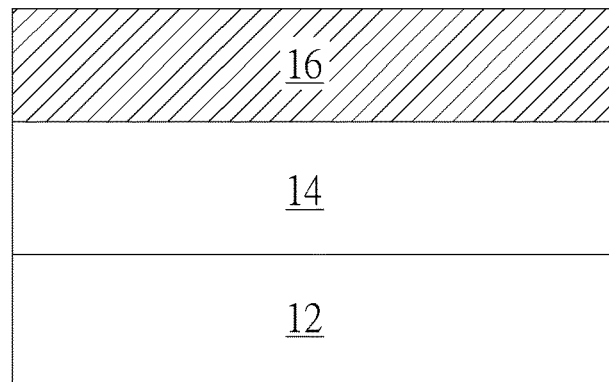
FIGS. 1-7 illustrate a method for fabricating HEMT according to an embodiment of the present invention.
Figure 1:
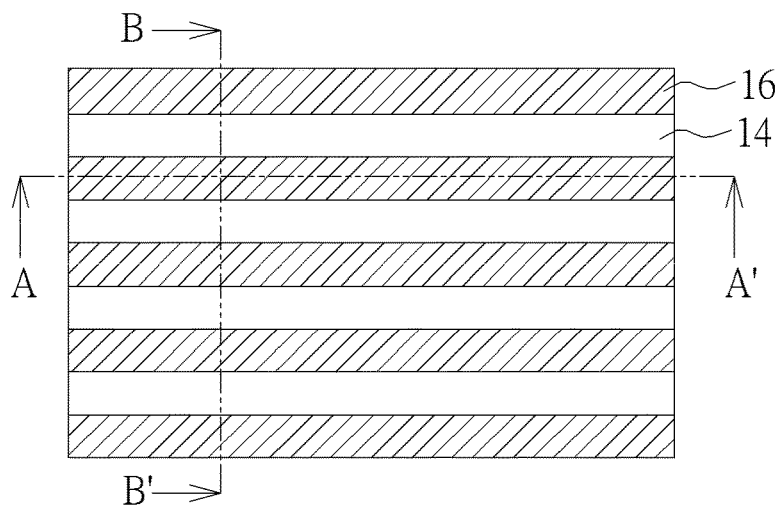
Figure 1:
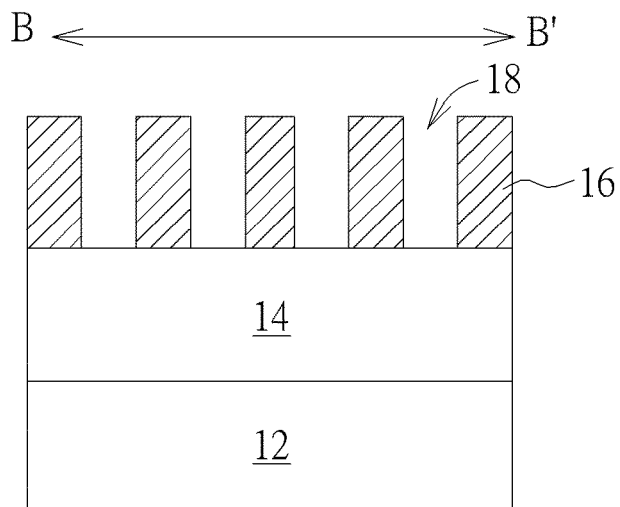

Referring to the FIG. 1, FIG. 1 illustrates a method for fabricating a HEMT according to an embodiment of the present invention, in which the middle portion of FIG. 1 illustrates a top view of the HEMT, the top portion of FIG. 1 illustrates a cross-section view of the middle portion along the sectional line AA', and the bottom portion of FIG. 1 illustrates a cross-section view of the middle portion along the sectional line BB'. As shown in the FIG. 1, a substrate 12 such as a substrate made from silicon, silicon carbide, or aluminum oxide (or also referred to as sapphire) is provided, in which the substrate 12 could be a single-layered substrate, a multi-layered substrate, gradient substrate, or combination thereof. According to other embodiment of the present invention, the substrate 12 could also include a silicon-on-insulator (SOI) substrate.

Next, a buffer layer 14 is formed on the substrate 12. According to an embodiment of the present invention, the buffer layer 14 is preferably made of III-V semiconductors such as gallium nitride (GaN), in which a thickness of the buffer layer 14 could be between 0.5 microns to 10 microns. According to an embodiment of the present invention, the formation of the buffer layer 14 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof. Next, a patterned mask 16 is formed on the buffer layer 14, in which the patterned mask 16 includes a plurality of openings 18 exposing the surface of part of the buffer layer 14. In this embodiment, the patterned mask 16 could be made of patterned resist or dielectric material including but not limited to for example silicon nitride.

Figure 2:
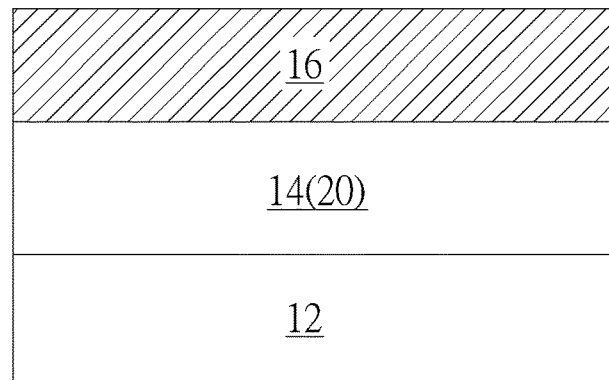
Figure 2:
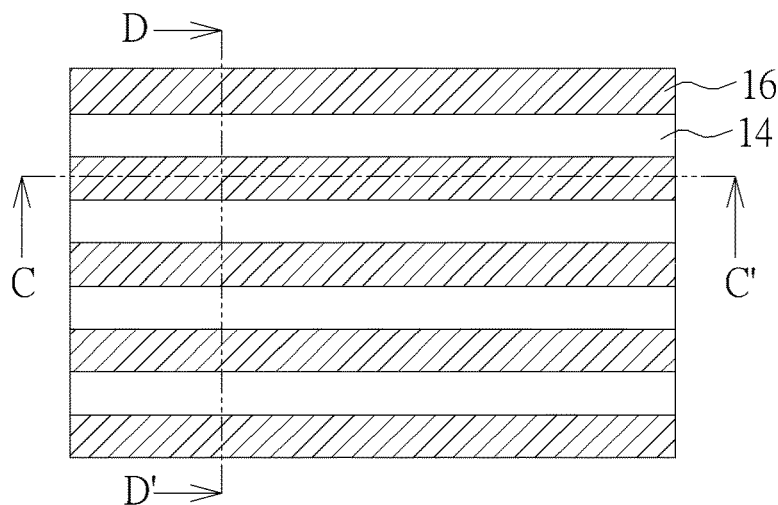
Figure 2:
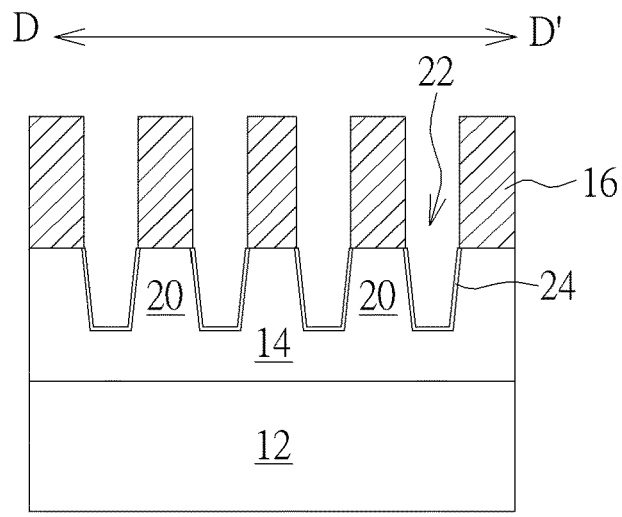

Referring to the FIG. 2, FIG. 2 illustrates a method for fabricating a HEMT according to an embodiment of the present invention following FIG. 1, in which the middle portion of FIG. 2 illustrates a top view of the HEMT, the top portion of FIG. 2 illustrates a cross-section view of the middle portion along the sectional line CC', and the bottom portion of FIG. 2 illustrates a cross-section view of the middle portion along the sectional line DD'. As shown in FIG. 2, the patterned mask 16 is used as mask to remove part of the buffer layer 14 to form a plurality of ridges 20 or ridge-shaped structures and a plurality of trenches 22 between the ridges 20, in which the ridges 20 and the trenches 22 are both extending along a first direction on the substrate 12. According to an embodiment of the present invention, the step of using the patterned mask 16 to remove part of the buffer layer 14 for forming ridges 20 and trenches 22 could be accomplished by a dry etching process or wet etching process according to the material of the patterned mask 16. For instance, if the patterned mask were made of patterned resist, it would be desirable to conduct a dry etching process by using oxygen plasma to remove part of the buffer layer 14 for forming the ridges 20 and trenches 22. If the patterned mask 16 were made of dielectric material such as silicon nitride, it would be desirable to conduct a wet etching process by using etchant such as phosphoric acid to remove part of the buffer layer 14 for forming the ridges 20 and trenches 22, which are all within the scope of the present invention.

It should be noted that whether the aforementioned dry etching process or wet etching process were conducted to form ridges 20 or ridge-like structures on the substrate 12 or buffer layer 14, the etchant or etching agent used during the etching process is likely to damage the surface of the buffer layer 14 and form a damaged layer 24 on the surface of the ridges 20 or more specifically on the surface of the ridges in the trenches 22 during the formation of the ridges 20. According to an embodiment of the present invention, the composition of the damaged layer 24 is preferably dependent upon the material of the buffer layer 14 used. For instance, if the buffer layer 14 were made of GaN, the damaged layer 24 preferably includes GaN or more specifically GaN containing carbon bonds. It should also be noted that since this embodiment pertains to the fabrication of a HEMT, the size and scale including widths and depths of the ridges 20 and/or trenches 22 formed at this stage preferably exceed the widths and depths of typical fin-shaped structures from fin field effect transistor (FinFET) devices significantly. In this embodiment, the width of each of the trenches 22 and/or ridges 20 is preferably greater than 180 nm or more preferably between 180-600 nm and the depth of each of the trenches 22 and/or ridges 20 is preferably greater than 180 nm or more preferably between 180-600 nm.

Figure 3:
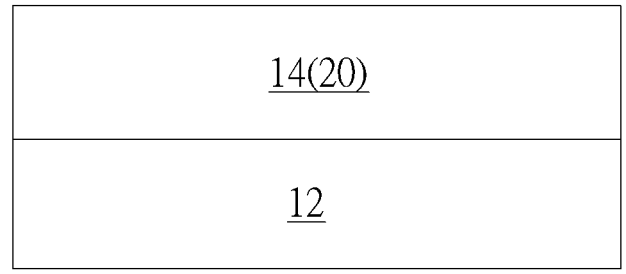
Figure 3:
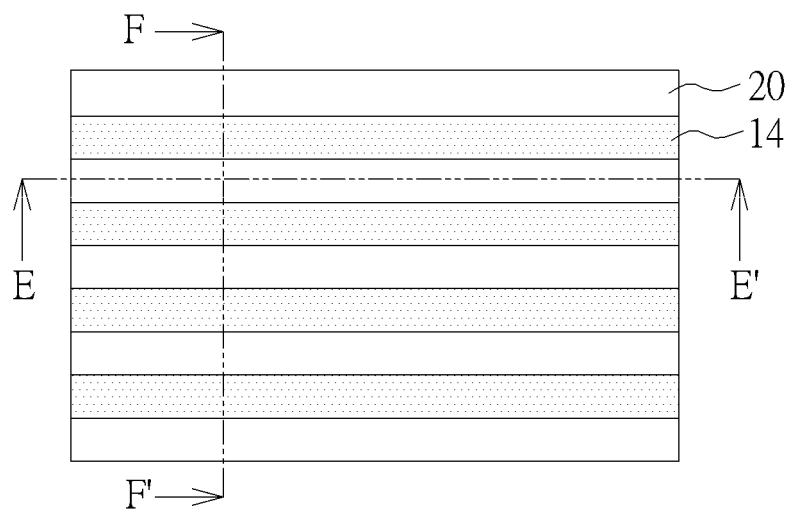
Figure 3:
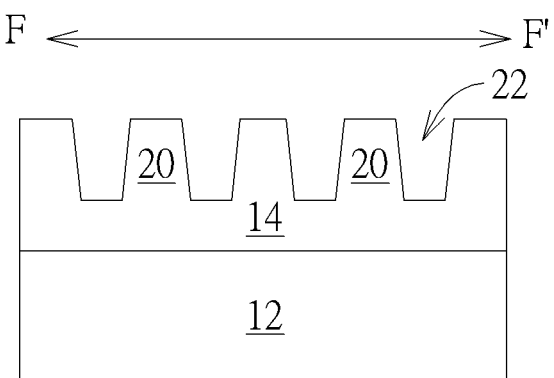

Referring to the FIG. 3, FIG. 3 illustrates a method for fabricating a HEMT according to an embodiment of the present invention following FIG. 2, in which the middle portion of FIG. 3 illustrates a top view of the HEMT, the top portion of FIG. 3 illustrates a cross-section view of the middle portion along the sectional line EE', and the bottom portion of FIG. 3 illustrates a cross-section view of the middle portion along the sectional line FF'. As shown in FIG. 3, after removing the patterned mask 16, a cleaning process is conducted to remove the damaged layer 24 completely and expose the buffer layer 14 in the trenches 22. In this embodiment, the cleaning agents used in the cleaning process could include but not limited to for example hydrochloric acid (HCl) and/or ammonium sulfide (($NH_4)_2S$).

Figure 4:
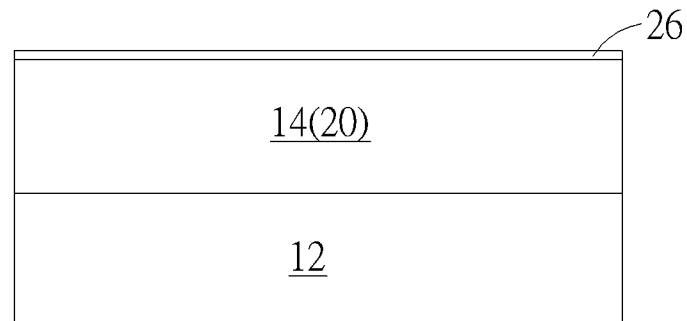
Figure 4:
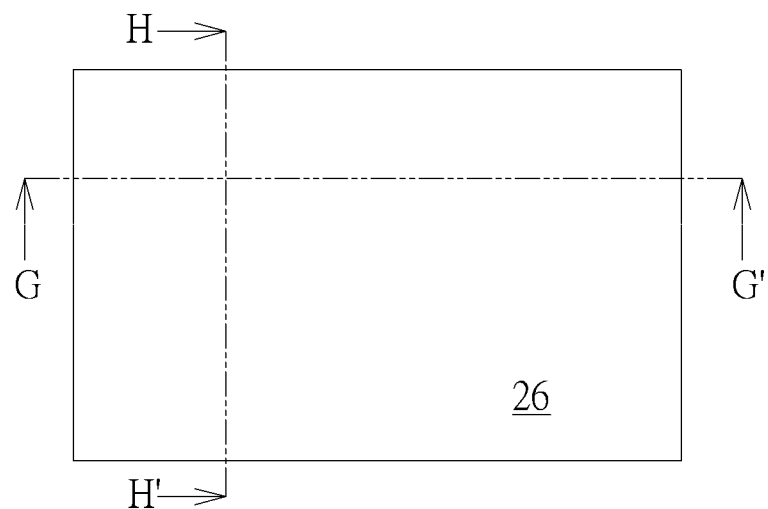
Figure 4:
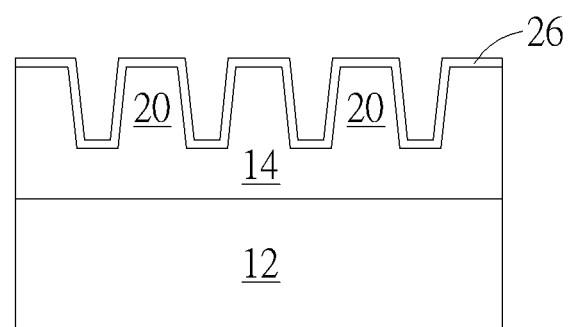

Referring to the FIG. 4, FIG. 4 illustrates a method for fabricating a HEMT according to an embodiment of the present invention following FIG. 3, in which the middle portion of FIG. 4 illustrates a top view of the HEMT, the top portion of FIG. 4 illustrates a cross-section view of the middle portion along the sectional line GG', and the bottom portion of FIG. 4 illustrates a cross-section view of the middle portion along the sectional line HH'. As shown in FIG. 4, a barrier layer 26 is then formed on the ridges 20. In this embodiment, the barrier layer 26 is preferably made of III-V semiconductor such as aluminum gallium nitride ($Al_xGa_{1-x}N$), in which $0<x<1$. Similar to the buffer layer 14, the formation of the barrier layer 26 on the surface of the ridges 20 and into the trenches 22 without filling the trenches 22 completely could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Figure 5:
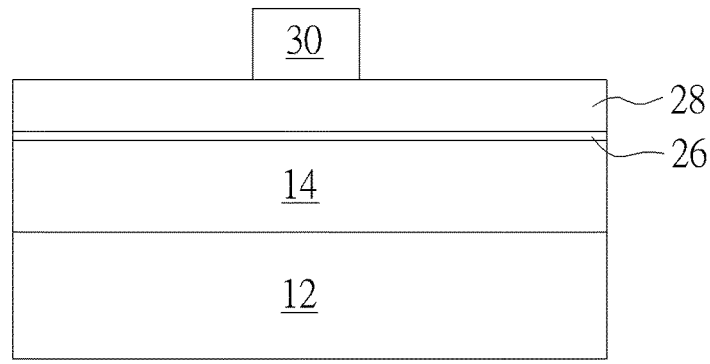
Figure 5:
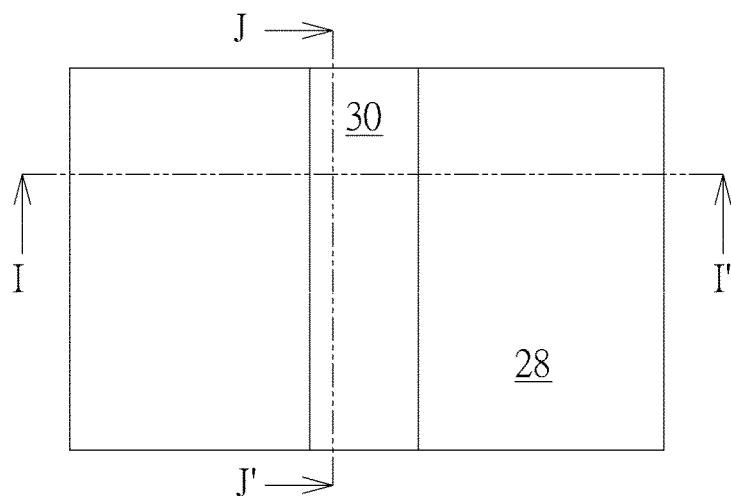
Figure 5:
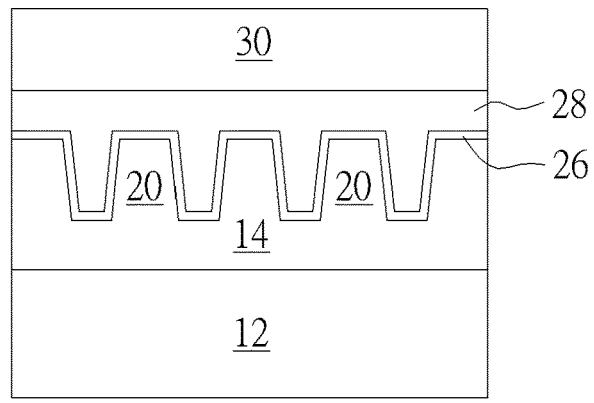

Referring to the FIG. 5, FIG. 5 illustrates a method for fabricating a HEMT according to an embodiment of the present invention following FIG. 4, in which the middle portion of FIG. 5 illustrates a top view of the HEMT, the top portion of FIG. 5 illustrates a cross-section view of the middle portion along the sectional line II', and the bottom portion of FIG. 5 illustrates a cross-section view of the middle portion along the sectional line jj'. As shown in FIG. 5, a p-type semiconductor layer 28 is formed on the surface of the barrier layer 26 to fill the trenches 22 completely, and another patterned mask 30 such as a patterned resist is formed on the p-type semiconductor layer 28, in which the patterned mask 30 is extending along a second direction (such as Y-direction as shown in middle portion of FIG. 5) orthogonal to the extending direction of the ridges 20 as part of the p-type semiconductor layer 28 adjacent to two sides of the patterned mask 30 is exposed.

In this embodiment, the p-type semiconductor layer 28 is preferably a III-V compound layer including p-type GaN (pGaN) and the formation of the p-type semiconductor layer 28 on the barrier layer 26 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Figure 6:
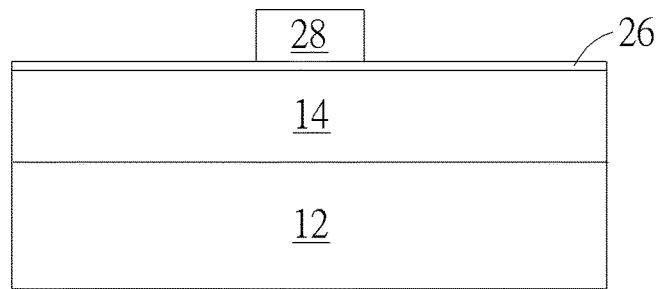
Figure 6:
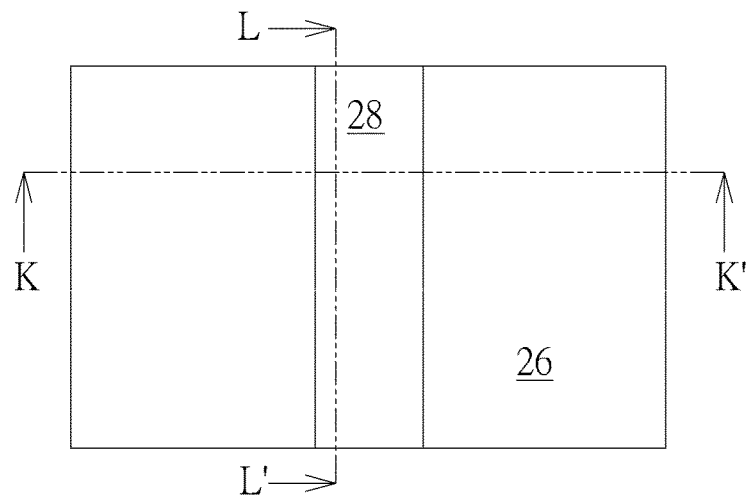
Figure 6:
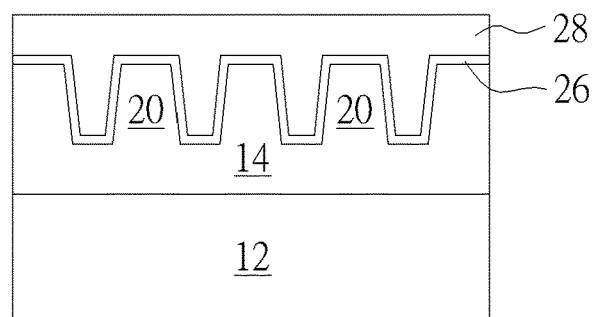

Referring to the FIG. 6, FIG. 6 illustrates a method for fabricating a HEMT according to an embodiment of the present invention following FIG. 5, in which the middle portion of FIG. 6 illustrates a top view of the HEMT, the top portion of FIG. 6 illustrates a cross-section view of the middle portion along the sectional line KK', and the bottom portion of FIG. 6 illustrates a cross-section view of the middle portion along the sectional line LL'. As shown in FIG. 6, a pattern transfer process could be conducted by using the patterned mask 30 as mask to remove the p-type semiconductor layer 28 on adjacent two sides. This transfers the pattern of the patterned mask 30 onto the p-type semiconductor layer 28 for forming a patterned p-type semiconductor layer 28, and the patterned mask 30 is removed thereafter. Preferably, the patterned p-type semiconductor layer 28 is formed extending along the same direction as the patterned mask 30 on the ridges 20 and orthogonal to the extending direction of the ridges 20.

Figure 7:
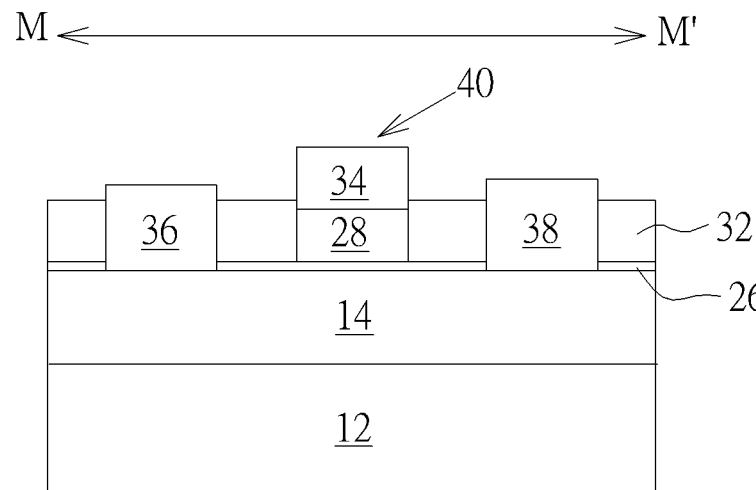
Figure 7:
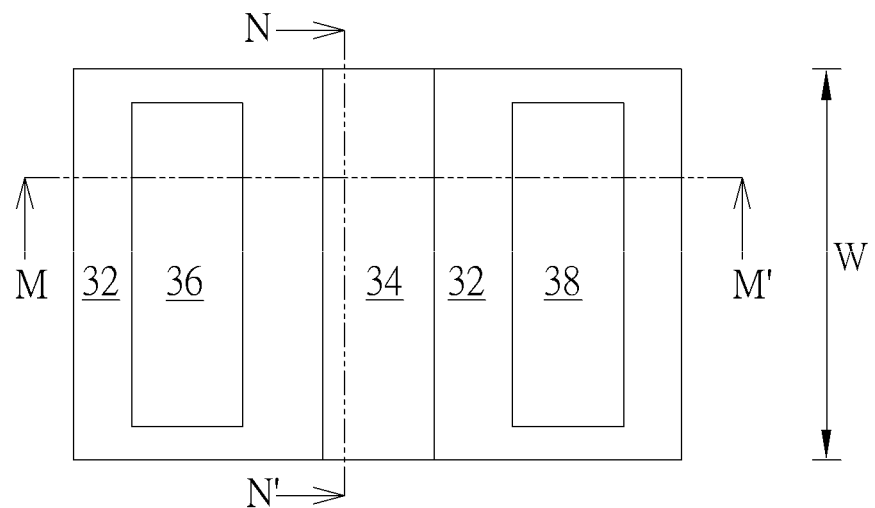
Figure 7:
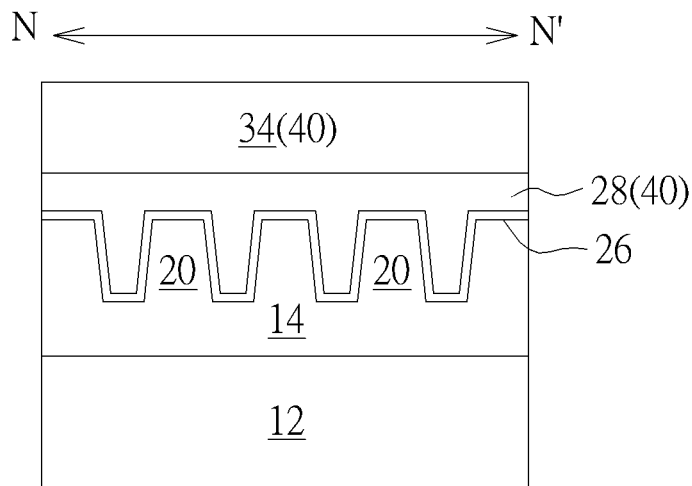
Figure 8:
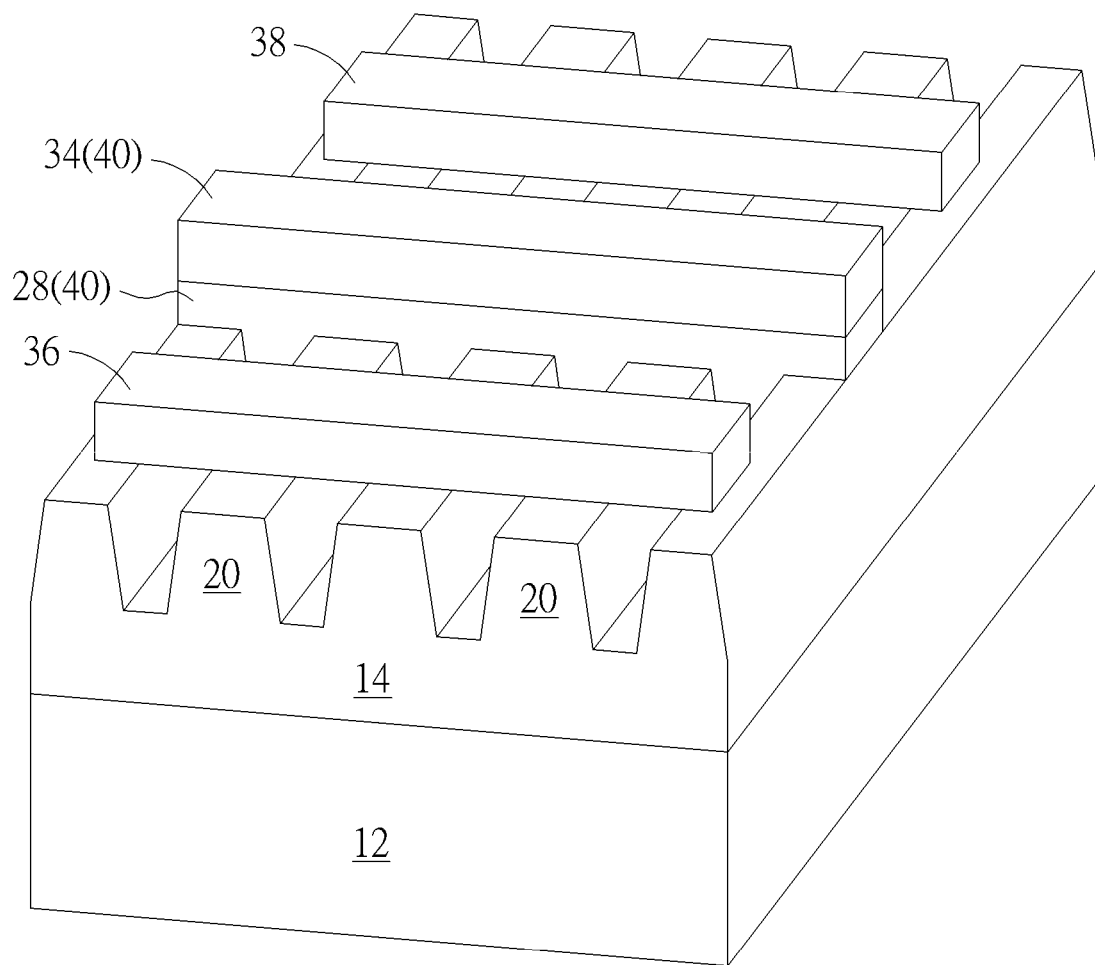
FIG. 8 illustrates a 3-dimensional view of a HEMT according to an embodiment of the present invention.

Referring to the FIGS. 7-8, FIG. 7 illustrates a method for fabricating a HEMT according to an embodiment of the present invention following FIG. 6, in which the middle portion of FIG. 7 illustrates a top view of the HEMT, the top portion of FIG. 7 illustrates a cross-section view of the middle portion along the sectional line MM', the bottom portion of FIG. 7 illustrates a cross-section view of the middle portion along the sectional line NN', and FIG. 8 illustrates a 3-dimensional view of the HEMT shown in FIG. 7. As shown in FIG. 7, a passivation layer 32 is then formed on the barrier layer 26 and the p-type semiconductor layer 28, a gate electrode 34 is formed on the p-type semiconductor layer 28, and source electrode 36 and drain electrode 38 are formed adjacent to two sides of the gate electrode 34, in which the p-type semiconductor layer 28 and the gate electrode 34 could constitute a gate structure 40 altogether.

In this embodiment, it would be desirable to first conduct a photo-etching process to remove part of the passivation layer 32 on the p-type semiconductor layer 28 for forming a recess (not shown), forming a gate electrode 34 in the recess, removing part of the passivation layer 32 and even part of the barrier layer 26 adjacent to two sides of the p-type semiconductor layer 28 to form two recesses, and then forming the source electrode 36 and drain electrode 38 in the two recesses adjacent to two sides of the gate electrode 34. It should be noted that the source electrode 36 and drain electrode 38 in this embodiment are preferably slot-shaped electrodes such that if viewed from a top view perspective as shown in the middle portion of FIG. 7 or a 3-dimensional perspective as shown in FIG. 8, the source electrode 36 and drain electrode 38 would be extending along the same direction as the p-type semiconductor layer 28 or gate electrode 34 adjacent to two sides of the p-type semiconductor layer 28 while the bottom surface of the two electrodes 36, 38 directly contacting multiple ridges 20 underneath and the passivation layer 32 surrounding the p-type semiconductor layer 28, the source electrode 36, and the drain electrodes 38.

It should be further noted that even though the bottom surface of source electrode 36 and drain electrode 38 directly contacts the ridges 20 or buffer layer 14, it would also be desirable to not removing any of the barrier layer 26 directly under the source electrode 36 and drain electrode 38 while patterning the passivation layer 32 to form the two electrodes 36, 38 and in such instance, the bottom surface of the source electrode 36 and drain electrode 38 would be contacting the barrier layer 26 directly, which is also within the scope of the present invention. Moreover, the passivation layer 32 surrounding the gate structure 40, source electrode 36, and the drain electrode 38 and filled in the trenches 22 between ridges 20 is omitted in FIG. 8 for clarification purpose.

In this embodiment, the gate electrode 34, the source electrode 36, and the drain electrode 38 are preferably made of metal, in which the gate electrode 34 is preferably made of Schottky metal while the source electrode 36 and the drain electrode 38 are preferably made of ohmic contact metals. According to an embodiment of the present invention, each of the gate electrode 34, source electrode 36, and drain electrode 38 could include gold (Au), Silver (Ag), platinum (Pt), titanium (Ti), aluminum (Al), tungsten (W), palladium (Pd), or combination thereof. Preferably, it would be desirable to conduct an electroplating process, sputtering process, resistance heating evaporation process, electron beam evaporation process, physical vapor deposition (PVD) process, chemical vapor deposition (CVD) process, or combination thereof to form electrode materials in the aforementioned trenches, and then pattern the electrode materials through one or more etching processes to form the gate electrode 34, source electrode 36, and the drain electrode 38. This completes the fabrication of a HEMT according to an embodiment of the present invention.

Typically, on-current ($I_{on}$) increase in HEMT device could be accomplished by increasing the overall width of gate electrode and such increase in overall width of gate electrode also means an increase in area and overall cost of the device. To resolve this shortcoming, the present invention first conducts a photo-etching process by using a patterned mask to form a plurality of ridge-shaped structures on the substrate or buffer layer made of GaN, and then forms a patterned p-type semiconductor layer standing astride the ridge-shaped structure to serve as gate structure and a source electrode and drain electrode adjacent to two sides of the p-type semiconductor layer. By following this approach, the HEMT of the present invention could obtain a much greater effective gate width and higher on-current as shown by the direction of gate width W extending orthogonal to the ridges 20 in middle portion of FIG. 7. Moreover, to prevent damaged layer formed during removal of the GaN buffer layer and formation of the ridge-shaped structures from affecting performance of the device, another embodiment of the present invention preferably conducts an additional cleaning process before forming the p-type semiconductor layer or barrier layer to remove all of the damaged layer to ensure stability and performance of the HEMT is maintained.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating high electron mobility transistor (HEMT), comprising:
    forming a buffer layer on a substrate;
    forming a patterned mask on the buffer layer;
    using the patterned mask to remove the buffer layer for forming ridges and a damaged layer on the ridges;
    removing the damaged layer;
    forming a barrier layer on the ridges; and
    forming a p-type semiconductor layer on the barrier layer.

2. The method of claim 1, further comprising removing the buffer layer to form trenches between the ridges.

3. The method of claim 2, wherein a width of the trenches is greater than 180 nm.

4. The method of claim 2, wherein a depth of the trenches is greater than 180 nm.

5. The method of claim 2, further comprising performing a dry etching process to remove the buffer layer for forming the ridges and the trenches.

6. The method of claim 2, further comprising performing a wet etching process to remove the buffer layer for forming the ridges and the trenches.

7. The method of claim 1, further comprising removing the patterned mask before removing the damaged layer.

8. The method of claim 1, wherein the damaged layer comprises gallium nitride (GaN).

9. The method of claim 1, wherein the buffer layer comprises GaN.

10. The method of claim 1, wherein the barrier layer comprise $Al_xGa_{1-x}N$.

11. The method of claim 1, wherein the p-type semiconductor layer comprises p-type gallium nitride (pGaN).

12. The method of claim 1, further comprising forming a source electrode and a drain electrode adjacent to two sides of the p-type semiconductor layer.

* * * * *